United States Patent [19]

Butt

[11] Patent Number: 4,577,056

[45] Date of Patent: Mar. 18, 1986

[54] HERMETICALLY SEALED METAL PACKAGE

[75] Inventor: Sheldon H. Butt, Godfrey, Ill.

[73] Assignee: Olin Corporation, New Haven, Conn.

[21] Appl. No.: 598,112

[22] Filed: Apr. 9, 1984

[51] Int. Cl.[4] ............................................. H01L 23/10
[52] U.S. Cl. ..................................... 174/52 FP; 357/74
[58] Field of Search ............. 174/52 H, 15 R, 52 FP, 174/52 PE, 16 HS, 68.5; 361/399, 414, 386, 401, 403; 29/827, 830; 156/89; 357/74, 81, 73; 428/432, 472, 632

[56] References Cited

U.S. PATENT DOCUMENTS

| | | |
|---|---|---|
| 3,340,602 | 9/1967 | Hontz . |
| 3,341,369 | 9/1967 | Caule et al. . |
| 3,435,516 | 4/1969 | Kilby . |
| 3,475,227 | 10/1969 | Caule et al. . |
| 3,549,784 | 12/1970 | Hargis . |
| 3,698,964 | 10/1972 | Caule et al. . |
| 3,730,779 | 5/1973 | Caule et al. . |
| 3,810,754 | 5/1974 | Ford et al. . |
| 4,291,815 | 9/1981 | Gordon et al. . |
| 4,410,927 | 10/1983 | Butt ............................... 174/16 HS X |
| 4,417,392 | 11/1983 | Ibrahim et al. .................... 29/830 X |
| 4,420,652 | 12/1983 | Ikeno ................................. 174/52 H |
| 4,461,924 | 7/1984 | Butt .................................. 174/52 FP |
| 4,491,622 | 1/1985 | Butt ................................... 29/830 X |

OTHER PUBLICATIONS

"Non–Hermetic Packaging for Hybrid Microcircuits" by Sergent et al., Electronic Packaging and Production, May, 1982, pp. 170–180.
"Hermetic Packages and Sealing Techniques"; by Aaron Weiss, Semiconductor International, Jun., 1982, pp. 111–119.

Primary Examiner—A. T. Grimley
Assistant Examiner—D. A. Tone
Attorney, Agent, or Firm—Howard M. Cohn; Barry L. Kelmachter; Paul Weinstein

[57] ABSTRACT

The present invention is directed to a hermetically sealed package adapted to form an enclosure for a semiconductor device. The package comprises a substrate with a refractory oxide layer on one surface and a metallized band on the refractory oxide layer. A metal cover is disposed on the substrate and sealed to the metallized band. A lead frame disposed between the substrate and cover comprises a plurality of lead elements which extend into the enclosure to be electrically connected to the semiconductor device. The lead frame has a refractory oxide layer on its surface to electrically insulate the lead frame from both the substrate and the cover. The lead frame also has a metallized band on its refractory oxide layer. A solder component bonds the cover onto the substrate with the lead frame extending therebetween so that the electronic device is sealed within the closure.

31 Claims, 5 Drawing Figures

HERMETICALLY SEALED METAL PACKAGE

The present invention relates to U.S. patent application Ser. No. 341,392 entitled "Semiconductor Casing" by S. H. Butt, filed Jan. 21, 1982 (now U.S. Pat. No. 4,461,924); Ser. No. 369,699 entitled "Improved Printed Circuit Board" by S. H. Butt, filed Apr. 19, 1982 (now U.S. Pat. No. 4,491,622); Ser. No. 369,785 entitled "Improved Chip Carrier" by S. H. Butt, filed Apr. 19, 1982, (now abandoned); Ser. No. 390,081 entitled "Improved Semiconductor Package" by S. H. Butt, filed June 21, 1982, (now abandoned); Ser. No. 390,095 entitled "Semiconductor Casing" by S. H. Butt, filed June 21, 1982, now U.S. Pat. No. 4,410,927; Ser. No. 398,497 entitled "An Improved Semiconductor Casing" by S. H. Butt, filed July 15, 1982 (now U.S. Pat. No. 4,480,262); Ser. No. 405,640 entitled "Improved Hermetically Sealed Semiconductor Casing" by S. H. Butt, filed Aug. 5, 1982, (now abandoned) Ser. No. 413,046 entitled "Multi-Layer Circuitry" by S. H. Butt, filed Aug. 30, 1982; Ser. No. 454,409 entitled "Semiconductor Packages" by S. H. Butt, filed Dec. 29, 1982 (now U.S. Pat. No. 4,524,238); Ser. No. 477,552 entitled "Reinforced Glass Composites" by S. H. Butt, filed Mar. 21, 1983; Ser. No. 517,592 entitled "Clad Metal Lead Frame Substrates" by S. H. Butt, filed July 27, 1983; and Ser. No. 539,449 entitled "Low Thermal Expansivity And High Thermal Conductivity Substrate" by S. H. Butt, filed Oct. 6, 1983.

While the invention is subject to a wide range of applications, it is especially suited for use in packaging electronic devices and will be particularly described in that connection. The package and method of fabricating the package preferably overcomes several limitations associated with glass bonded hermetically sealed semiconductor packages.

The present technology for manufacturing hybrid semiconductor packages commonly uses an aluminum oxide, ceramic substrate with circuitry upon its surface. Circuitry is formed by first silk screening a circuit pattern on the substrate with a metallizing paste whose principal constituent of powdered gold, silver or copper is suspended in organic additives to impart fluid properties to the paste. The metallizing paste can also include a permanent binder of low melting point glass frit which bonds the metallized layer to the ceramic substrate. Next, the substrate is fired at a temperature range to drive off the organic constituents of the paste and sinter the metal powder into continuous conductive metal traces upon the surface of the substrate.

Following this step, the substrate is mounted in a package having sidewalls formed from a low expansivity alloy such as 42 Ni-Fe or 29 Ni-17 Co-Fe (Kovar). The lead wires or pins passing through the metal sidewalls are generally electrically isolated from the sidewalls by a sealing glass. Then, semiconductor chips and other components of the hybrid circuit are mounted and electrically connected to the circuitry. Finally, a metal lid is brazed or soldered to the metal sidewall to seal the package. Typically, the lid is produced from the same material as the sidewalls. The completed package may be mounted on a heat sink to dissipate heat generated in the package.

As individual semiconductor components become more elaborate, more functions are provided on a chip and the functions are packed closer together. The amount of heat to be dissipated from the package increases correspondingly. Unfortunately, the heat transfer encounters a relatively high resistance path from the semiconductor chip or other sources of heat inside the package to the outside where a heat sink may be provided.

Many variations of package structures combining ceramics and metals are known in the prior art. For example, U.S. Pat. No. 3,340,602 to Hontz discloses that "the invention contemplates, in preferred practice thereof, the use of a gold-tin alloy soldier, preferably 20% tin by weight, to solder bond a gold plated cap to a gold plated housing within which there is disposed a silicon semi-conductive device comprising gold-to-aluminum solder connections." U.S. Pat. No. 3,435,516 to Kilby discloses, for example, "methods of fabricating packages for semiconductor devices and methods for mounting and/or sealing bars of thin semiconductive materials having various circuit connections and terminals formed thereon." U.S. Pat. No. 3,549,784 to Hargis and U.S. Pat. No. 4,291,815 to Gordon et al. disclose ceramic-metallic composites which are suitable for packaging semiconductor devices. Other packaging concepts known in the prior art are disclosed in the articles entitled "Non-Hermetic Packaging For Hybrid Microcircuits" by Sergent et al., Electronic Packaging and Production, May, 1982, Pages 170–180, and "Hermetic Packages and Sealing Techniques" by Aaron Weiss, Semiconductor International, June, 1982, Pages 111–119.

In the embodiments described in the prior art mentioned hereinabove, the lead wires or pins which pass through the sidewall of the packages are electrically isolated from the covers and substrates and hermetically sealed in place by the use of a suitable sealing glass. In general, these sealing glasses are fragile and brittle and, therefore, susceptible to cracking and damage as a result of handling. These potential cracks may result in the loss of hermeticity within the package.

In certain prior art embodiments, the hermetically sealed package is fabricated by glass sealing a lid onto a substrate. Glass sealing usually requires relatively high temperatures for longer exposure times as compared to solder bonding. These factors may necessitate the use of aluminum lead wires to avoid the formation of undesirable intermetallics at the interface between the conventional gold lead wires and the aluminum metallization on the semiconductor chip.

It is a problem underlying the present invention to provide a hermetically sealed package for an electrical component which can be bonded at a relatively low temperature for a relatively short period of time and which eliminates the need for a solder glass.

It is an advantage of the present invention to provide a hermetically sealed package for an electrical component which obviates one or more of the limitations and disadvantages of the described prior arrangements.

It is a further advantage of the present invention to provide a hermetically sealed package for an electrical component which uses a relatively low temperature bonding solder seal.

It is a still further advantage of the present invention to provide a hermetically sealed package for an electronic component which is relatively inexpensive to manufacture.

Accordingly, there has been provided a hermetically sealed package adapted to form an enclosure for a semiconductor device. The package comprises a substrate with a refractory oxide layer on one surface and a metallized band on the refractory oxide layer. A metal cover is disposed on the substrate and sealed to the metallized band. A lead frame disposed between the substrate and cover includes a plurality of lead elements extending into the enclosure for electrical connection to the semiconductor device. The lead frame has a refractory oxide layer on its surface to electrically insulate the lead frame from both the substrate and the cover. The lead frame also has a metallized band on its refractory oxide layer. A solder component bonds the cover onto the substrate with the lead frame extending therebetween so that the electronic device is sealed within the closure.

The invention in further developments of the invention are now elucidated by means of the preferred embodiments shown in the drawings.

Figure 1:
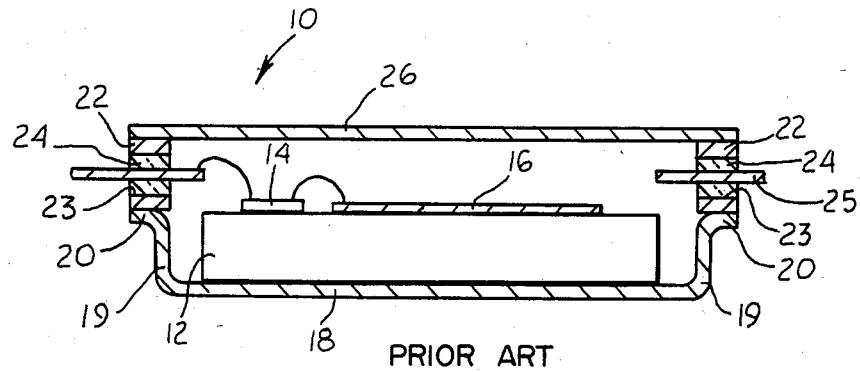
FIG. 1 is a cross section of a prior art hybrid circuit semiconductor package.

Referring to FIG. 1, there is shown a prior art hybrid circuit semiconductor package 10. The package includes a ceramic substrate 12 having a semiconductor device 14 and a metallized circuit pattern 16 affixed to the top surface of the substrate. The substrate 12 is mounted onto a base member 18. The base member includes walls 19 extending upward from the periphery of the base. A flange 20 may extend outward from the walls 19. A metal sidewall 22 is brazed or soldered onto the flange 20. The sidewall includes a plurality of openings 23 having leads 25 passing therethrough and bonded by solder glass 24 to electrically isolate the leads from the sidewall. A cap 26, typically formed of the same material as the base 18, i.e. a low expansivity alloy such as 42 Ni-Fe or 29 Ni-17 Co-Fe, is brazed or soldered to the top of metal sidewall 22. As explained hereinabove, the hybrid package 10 is a rather poor dissipator of heat because of the relatively high resistance heat transfer path from the semiconductor device or other sources of heat inside the package to the outside of the package. The path includes the thick ceramic substrate 12 and the poor thermal conductive materials of the base member, sidewall and cover.

Figure 2:
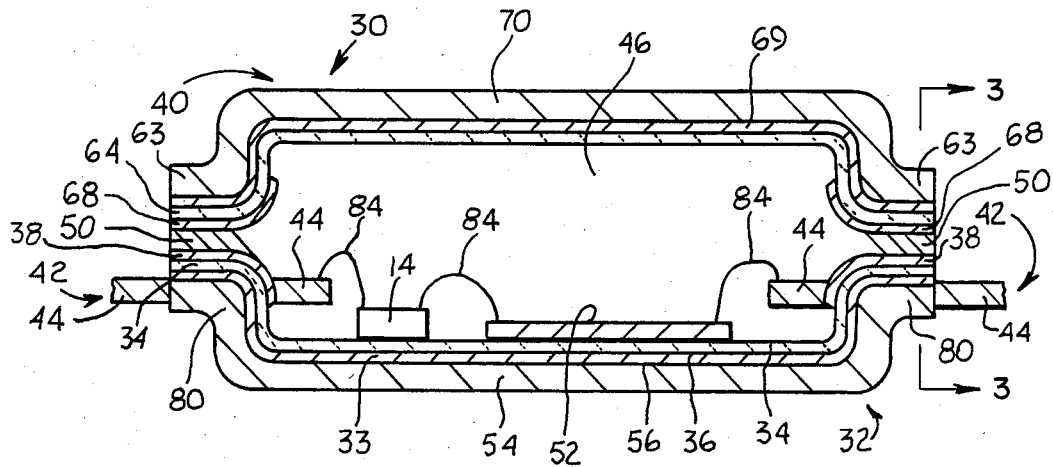
FIG. 2 is a cross section of a hybrid semiconductor package in accordance with the present invention.

Referring to FIG. 2, there is illustrated an improved hybrid circuit package 30 which has a number of novel features that provide significantly improved operating characteristics in comparison with the prior art sealing package. Although it is within the scope of the present invention to seal the package without any concern as to hermeticity, package 30 is disclosed as preferably being hermetically sealed. Package 30 comprises a metal or metal alloy substrate or base member 32 having a refractory oxide layer 34 on a first surface 36 thereof. A metallized band 38 is adhered to the refractory oxide layer 34. A metal or metal alloy cover member 40 is disposed adjacent the substrate member 32 and sealed to the metallized band 38. A metal or metal alloy lead frame member 42 is disposed between the cover and the substrate members. The lead frame comprises a plurality of lead elements 44 extending both into the enclosure 46 as well as external to the package 30. The lead frame member has a refractory oxide layer 47 disposed on the lead frame surface to electrically insulate the lead frame member from the base and the cover. A metallized band 48 is also adhered to the refractory oxide layer on the lead frame member. A solder component 50 between the cover and substrate bonds the lead frame member therebetween so that an electronic device, such as a semiconductor 14, is hermetically sealed within the enclosure 46.

The preferred alloy for use in the embodiments of the present invention requiring a metal or metal alloy having a refractory oxide layer is a copper base alloy consisting essentially of an effective amount up to about 12% aluminum for forming a refractory oxide layer and the balance copper. A preferable alloy consists essentially of 0.7-10% aluminum, 0.001-3% silicon, and if desired, a grain refining element selected from the group consisting of iron up to 4.5%, chromium up to 1%, zirconium up to 0.5%, cobalt up to 1% and mixtures of these grain refining elements and the balance copper. A CDA Alloy C63800 consisting essentially of 2.5-3.1% aluminum, 1.5-2.1% silicon, and the balance copper is a particularly useful material for this invention. Impurities may be present which do not prevent bonding in a desired environment.

The alloys useful with this invention and, especially Alloy C63800 as described in U.S. Pat. Nos. 3,341,369 and 3,475,227 to Caule et al. which disclose copper base alloys and processes for preparing them, have a refractory oxide layer formed on a portion or all of their exposed surfaces. The oxide layer may include complex oxides formed with elements such as alumina, silica, tin, iron, chromia, zinc, and manganese. Most preferably, the refractory oxide layer is substantially aluminum oxide ($Al_2O_3$). The formation of the refractory oxide to the substrate may be accomplished in any desired manner. For example, a copper base alloy such as Alloy C63800 may be preoxidized in gases having an extremely low oxygen content. This is accomplished by placing the Alloy C63800 in a container with 4% hydrogen, 96% nitrogen and a trace of oxygen released from a trace of water mixed in the gas. This gas may be heated to a temperature of between about 330° C. and about 820° C. Depending on the temperature and amount of time the alloy is left in the heated gas, a refractory oxide layer of a desired thickness forms on the exposed surface of the alloy.

The present invention is not restricted to applications of Alloy C63800 but includes the broad field of metals or alloys which have the ability to form continuous or semi-continuous oxide layers on their surfaces. Several examples of other metal alloys which form refractory oxide layers, such as nickel base and iron base alloys, are disclosed in U.S. Pat. Nos. 3,698,964, 3,730,779 and 3,810,754.

Figure 3:
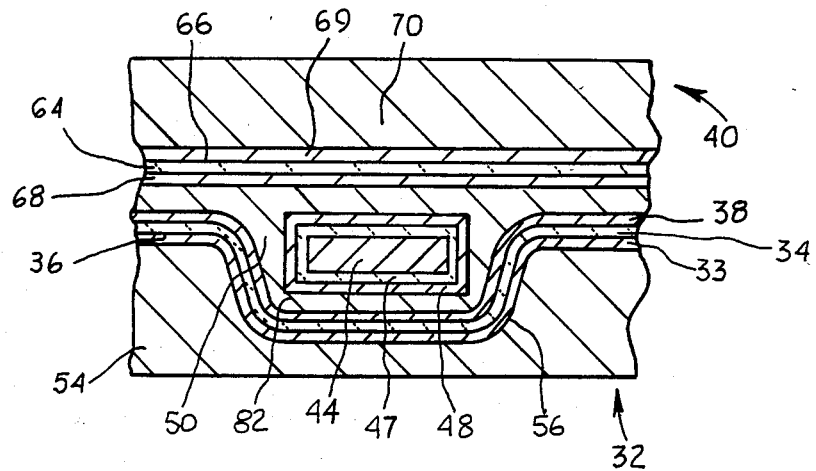
FIG. 3 is a partial, enlarged sectional view through line 3—3 of FIG. 2.

Referring to FIGS. 2 and 3, the substrate 32 is preferably formed of a copper base alloy having a refractory oxide layer of a material such as aluminum oxide on at least the surface 36. Of course, in generating the aluminum oxide layer, it will be formed on the remaining exposed surfaces unless special precautions are taken to prevent this formation. The aluminum oxide layer has a thickness of between about 100 to about 1000 Å and preferably about 200 to 1000 Å and optimally between about 500 to about 1000 Å. Even though the oxide film is continuous and reasonably uniform in thickness, it is quite thin and imposes a minimum thermal barrier to the transfer of heat from within the enclosure, through the substrate and external to the package. Also, the melting point of the refractory oxide layer is at least above about 1000° C. This is much higher than the temperature required for sintering of the conductors and other thick film components such as the metallized bands 38 and 48 or for melting the solder component 50. Therefore, during the fabrication of the sealed package, the oxide layers 34 and 47 are not damaged and the important characteristic of electrically insulating the components within the package from the substrate is not affected.

The metallized surfaces 38 and the passive circuitry 52 may be formed on the refractory oxide layer by conventional techniques such as applying a thick film material or electroless plating. The thick film material may be a screen printable composition in the form of a metallized paste which will effectively metallize the exposed surface of the oxide layer 34 to which it is applied. The conventional metallized pastes are mixtures of metal powders suspended in organic additives to impart fluid properties to the paste for screen printing applications. Known organic additives include methyl, ethyl, butyl, and propyl alcohol. However, the invention is not limited to these organic additives and may include any additive or combination of additives which would be suitable for the present invention. The metallized pastes can also include a permanent binder of low melting point glass frit which bonds the resulting metallized layer to the refractory oxide surface. These glass frits may include, but are not limited to, materials such as bismuth oxide, cadmium oxide, and lead brosilicate. Metallized pastes are screen printed onto the desired refractory oxide layer surfaces of the substrate, lead frame and cover member. Subsequently, they are baked at a low temperature, such as about 125° C., to burn out the volatile organic additives. The dried metallized paste is then fired at a desired elevated temperature such as between about 750° C. to about 1050° C. to fuse the metal powders and bond the resulting metallized layer to the refractory oxide surface on which it has been applied.

The metallized surface forming the passive circuitry 52 may be formed into a circuit pattern by the silk screening process. In this instance, the metal powders which are the principal constituent of the metallized paste would preferably include, but are not limited to, gold, silver, copper and alloys thereof. It is also possible to provide passive circuit components such as resistors, in the metallized thick film. Besides the passive circuit pattern 52, a metallized surface such as band 38 can be applied to the refractory oxide on the substrate at locations which are in contact with other materials such as solder component 50. The metallized bands 38 provide a suitable surface to enable the metal solder component to bond to substrate 32.

Although the substrate 32 must include a layer of relatively low coefficient of conductivity material 33 to which a refractory oxide layer can be easily applied, a high conductivity metal or metal alloy 54 may be clad onto a surface 56 of substrate 33. The conductive alloy preferably has a coefficient of conductivity in excess of 50% IACS and may include copper alloys such as C15100, C19400, or C19500.

A metal or alloy lead frame member 42 is disposed between the substrate 32 and the cover 40. The lead frame includes a plurality of lead elements 44 which extend into the enclosure 46 for electrical connection to the semiconductor device 14 or to the passive circuitry 52. The leads also extend external to the package for electrical connection to a conventional device such as a printed circuit board. The leads 44 may be formed into a rectangular cross section as shown in FIG. 3 or any other desired cross-sectional shape such as circular. The lead frame is fabricated from a metal or metal alloy capable of having a refractory oxide layer 47 applied to its exposed surface. The oxide layer 47 covers at least the portion of the lead frame which contacts other components of the package so as to electrically insulate the lead frame and prevent short circuiting between the lead frame and the semiconductor package. The lead frame is preferably selected from the same material as used for substrate 32 described hereinabove. A metallized band 48 is applied to the exposed sections of the refractory oxide layer 47 to contact with the solder component 50 of the package. The configuration of the lead frame is not a part of the present invention and, therefore, can be of any conventional shape as required.

The solder component 50 may be in the form of a metallized paste or a stamped preform of a soft solder alloy. The stamped preforms are commercially available in a wide range of alloys having melting points generally below 450° C. The stamped preforms may be fabricated from alloys of lead, tin, bismuth, gold, silver, antimony and zinc. It is, however, in the scope of the present invention to use any solder alloy which is capable of being bonded to both the metallized surface 48 and the metallized surface 38. It is also thought that two solders having different melting points may be conveniently applied to the present invention. A higher melting point solder having a melting point between about 325° C. to about 400° C., such as a lead-silver solder or an indium containing solder, may be used to bond the lead frame to the substrate 32. Then, a lower melting point solder having a melting point between about 265° C. to about 325° C., such as, for example, tin-lead eutectic may be used to attach the cover 40 after the semiconductor components and other circuitry have been connected within the package. Using the two different melting point solders is beneficial for preventing loss of alignment of the lead frame through reflowing of the high temperature solder during the bonding of the cover 40 onto the substrate.

A metal or metal alloy cover member 40 is disposed against the substrate 32 and sealed to the metallized band 38 by the solder component 50. The cover may be formed into a cup-like shape as shown in FIG. 2. A flange 63 is preferably disposed about the opening of the cup-like shape. The surface of the flange which is in contact with the solder component 50 is preferably flat. The cover member 40 has a refractory oxide layer 64 formed on exposed surface 66. A metallized layer 68 is applied to the refractory oxide layer 64. Cover member 40 of this embodiment, as shown in FIG. 3, would have a layer 69 preferably fabricated from the same metal or metal alloy as substrate 33 described hereinabove. Further, the refractory oxide layer 64 would be applied in the same manner as discussed in connection with the refractory oxide layer 34. The metallized layer 68 would be deposited onto the refractory oxide layer 64 in the same manner as discussed with regards to the application of metallized layer 38 to oxide layer 34. A cladding 70 may be applied to the layer 69 by any conventional technique. The cladding may be a conductive metal or metal alloy member identical or similar to cladding 54 and having a conductivity in excess of 50% IACS.

Referring to FIGS. 2 and 3, the first embodiment of the present invention is illustrated. The substrate 32 is formed into a cup-like shape having a flange 80 extending about the opening of the cup-like shape. The flange has a plurality of recesses 82 which are adapted to receive the leads 44 of the lead frame 42. Any number of recesses may be disposed about the periphery of the package to accommodate any number of leads as required. The substrate 32 is preoxidized to form the refractory oxide layer 34. Next, the thick metal films forming the metallized layer 38 and the passive circuitry 52 are applied to desired locations on the substrate. Then, lead frame 42 is bonded to the substrate by a solder 50. As mentioned hereinabove, it may be preferable to bond the lead frame with a high melting point solder. Then the cover member is bonded with a lower melting point solder which does not effect the higher melting point solder and thereby prevents realignment of the lead frame. The electronic devices such as semiconductor chip 14 can now be attached to the substrate by any conventional bonding agent such as, for example, a metallized epoxy. The electronic components are connected to each other and the leads 44 by wires 84. Finally, the cover 40 is soldered onto the substrate 32 by the solder component 50. Preferably this portion of component 50 is a lower melting point solder which bonds the metallized surface 68 of the cover member to the relatively higher melting point solder which bonds the lead frame 42 into a recess 82.

The resulting structure may form a hybrid hermetically sealed package 30 as shown in FIG. 2. The package has the advantage of not requiring any sealing glass nor high temperature exposure usually associated therewith. The soldering may be accomplished rapidly and at relatively low temperatures such as below about 325° C. Below this temperature, thermosonic gold wire bonding may be used to hook up the electronic device to the lead frame. This economical approach is possible because the more expensive fabrication required to bond aluminum lead wires is primarily resorted to for preventing undesirable intermetallic formation at the interface between the lead wires and the metallization on the semiconductor chip which is caused by the higher temperatures and longer times associated with glass sealing. Although a hybrid package is illustrated in FIG. 2, it is also within the terms of the present invention to hermetically seal many types of semiconductor packages using the solder bonding as disclosed herein.

Figure 4:
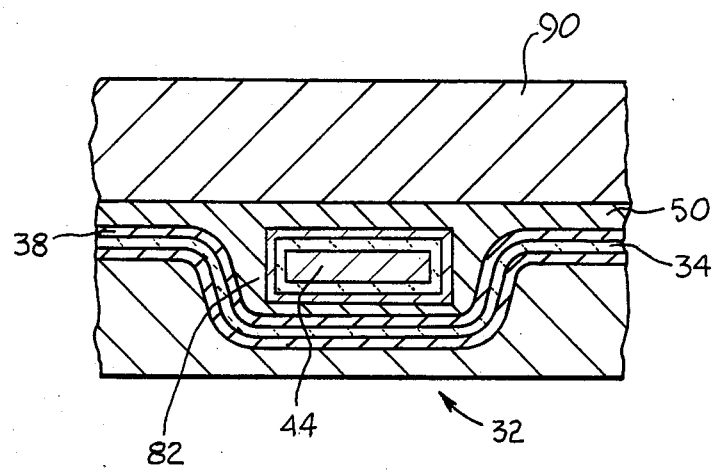
FIG. 4 is a second embodiment of an alternative bonding technique in accordance with the present invention.

Referring to FIG. 4, a second embodiment is illustrated which differs from the first embodiment of FIGS. 2 and 3 in that the interface between a cover 90 and the substrate 32 is slightly modified. Many components of the second embodiment including the substrate 32, the lead element 44 and the solder component 50 are essentially identical to the comparable components of the first embodiment and are, therefore, designated by the same reference numerals. The cover member 90 is preferably fabricated from a material having a conductivity greater than about 50% IACS and being bondable to the solder component 50. This material may be comprised of any of the metal or metal alloys discussed as being suitable for cladding 54 described hereinabove. The package may be assembled without preoxidation and metallizing the surface of the cover member 90 which is bonded to substrate 32. As with the first embodiment, the substrate 32 is preoxidized with a refractory oxide coating 34 and then coated with metallized layer 38. Next, the lead frame is soldered onto the substrate 32 with solder 50. After the semiconductor chip is bonded onto the substrate and the electrical connections are completed, the cover member can be soldered onto the substrate by any conventional means.

Figure 5:
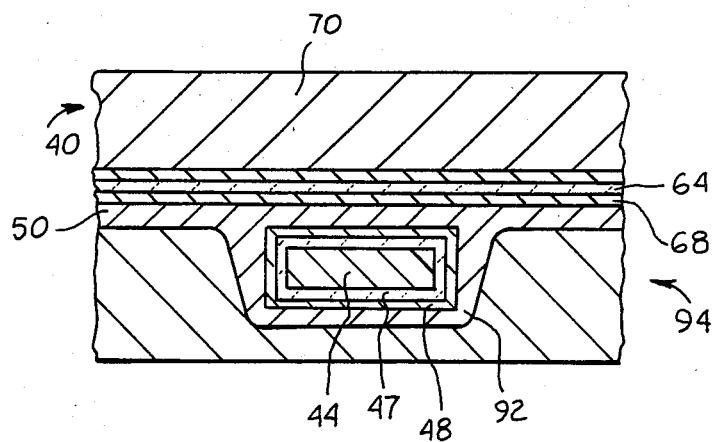
FIG. 5 is a third embodiment of an alternative bonding technique in accordance with the present invention.

FIG. 5 is a third embodiment of the present invention, similar to the first embodiment, except that the substrate 94 does not require a refractory oxide coating or a metallized layer. Many of the components of the third embodiment are the same as comparable ones in the first embodiment and are designated by the same reference numerals. Prior to bonding, substrate 40 is shaped and preoxidized with refractory oxide layer 64 and coated with a metallized surface 68. The lead element 44 having a refractory oxide layer 47 and a metallized surface 48 applied thereon is disposed within a plurality of recesses 92 shaped into substrate 94. The substrate 94 is preferably fabricated from a material having a high conductivity in excess of about 50% IACS and being bondable to the solder component 50. This material may be comprised of any of the metals or metal alloys suggested for cladding 54 described hereinabove. The third embodiment is suitable for any type of semiconductor package including the hybrid package illustrated in FIG. 2.

The three embodiments described hereinabove have one or more recesses 82 and 92 coined into the flange 80 provided around the periphery of the cup-like shaped substrate members 32 and 94. The flange 63 associated with the cover members 40 and 90 preferably have a flat surface to be bonded adjacent the flanges 80 of the substrates. It is also within the terms of the present invention to coin corresponding recesses in each of the flanges 63 and 80 and to position the lead frame between the two recesses. This would provide for a larger tolerance in positioning the lead frame during the fabrication of the package. Also, it is within the terms of the present invention to coin the plurality of recesses in the flange 63 of either cover member and to form the surface of the flange 80 of the either substrate substantially flat.

The prior art citations set forth in this application are intended to be incorporated by reference herein.

It is apparent that there has been provided in accordance with this invention embodiments of a hermetically sealed metal package which satisfies the objects, means, and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A hermetically sealed package forming an enclosure adapted to receive an electronic device, comprising:
    a first metal or metal alloy member having a first refractory oxide layer on at least a first surface thereof, said first member having at least a first metallized band on said first refractory oxide layer;
    a second metal or metal alloy member disposed against said first member and being sealed to said first metallized band;
    a metal or metal alloy lead frame member disposed between said first and second members, said lead frame member comprising a plurality of lead elements extending both into said enclosure being adapted for electrical connection to the electronic device and external to said enclosure, said lead frame member further having a second refractory layer on at least a portion of the lead frame surface to electrically insulate said lead frame member from said first and second members, said lead frame member further having at least a second metallized band on said second refractory oxide layer; and solder means for bonding said first metallized band to said second member and the second metallized band of the lead frame member between said first and second members whereby the electronic device is sealed within the enclosure.

2. The package of claim 1 wherein said first member has a cup-like shape having a first flange extending about the cup-like shape, said first flange having a plurality of recesses therein being adapted to receive the lead elements of said lead frame, said first flange further having said first metallized band disposed on a surface of said first flange and within the recesses for bonding to said solder means.

3. The package of claim 2 wherein said refractory oxide layer comprises aluminum oxide.

4. The package of claim 3 wherein said first metal or metal alloy member comprises a copper or copper alloy.

5. The package of claim 4 wherein said copper alloy consists essentially of an effective amount of aluminum to form the aluminum oxide layer and the remainder copper.

6. The package of claim 5 wherein said copper alloy consists essentially of an effective amount of up to 12% aluminum to form an aluminum oxide layer and the remainder copper.

7. The package of claim 3 wherein said first metal or metal alloy member comprises an iron or iron alloy.

8. The package of claim 3 wherein said first metal or metal alloy member comprises a nickel or nickel alloy.

9. The package of claim 3 wherein said solder means comprises a first solder component for sealing said lead elements into said recesses, and
a second solder component for bonding said first member to said second member.

10. The package of claim 9 wherein said first solder component has a higher melting point than said second solder component.

11. The package of claim 2 wherein said first member is a substrate having the electronic device attached thereto, and
said second member is a cover.

12. The package of claim 11 wherein said cover has a coefficient of conductivity in excess of about 50% IACS.

13. The package of claim 12 wherein said first member has a clad layer of metal or metal alloy having a coefficient of conductivity in excess of about 50% IACS, said clad layer being disposed against a second surface of said first member opposite said first surface.

14. The package of claim 1 wherein said second member has a cup-like shape having a first flange extending about the cup-like shape, said first flange having a plurality of recesses therein being adapted to receive the lead elements of said lead frame whereby said solder means disposed in said recesses bonds the lead elements into said recesses.

15. The package of claim 14 wherein said first member is a substrate having the electronic device attached thereto, and said second member is a cover.

16. The package of claim 15 wherein said second metal or metal alloy member comprises a copper or copper alloy.

17. The package of claim 16 wherein said refractory oxide layer comprises aluminum oxide.

18. The package of claim 17 wherein said copper alloy consists essentially of an effective amount of aluminum to form the aluminum oxide and the remainder copper.

19. The package of claim 18 wherein said copper alloy consists essentially of an effective amount of up to 12% aluminum to form an aluminum oxide and the remainder copper.

20. The package of claim 15 wherein said first metal or metal alloy member comprises an iron or iron alloy.

21. The package of claim 15 wherein said first metal or metal alloy member comprises a nickel or nickel alloy.

22. The package of claim 15 wherein said substrate has a coefficient of conductivity greater than about 50% IACS.

23. The package of claim 1 wherein said second metal or metal alloy member has at least a third refractory oxide layer on at least a first surface thereof, said second member having at least a third metallized band on said third refractory oxide layer, said third metallized band extending around the periphery of said second member, and
said solder means bonding to said first and third metallized bands to form said sealed enclosure.

24. The package of claim 23 wherein said second member has a cup-like shape having a second flange extending about the cup-like shape, said second flange having a plurality of recesses adapted to mate with the recesses of said first flange and to receive the lead elements of said lead frame therebetween.

25. The package of claim 24 wherein said first, second and third refractory oxide layers comprise aluminum oxide.

26. The package of claim 25 wherein said first and second metal or metal alloy members comprise a copper or copper alloy.

27. The package of claim 26 wherein said copper alloy consists essentially of an effective amount of aluminum to form the aluminum oxide and the remainder copper.

28. The package of claim 27 wherein said copper alloy consists essentially of an effective amount of up to 12% aluminum to form an aluminum oxide and the remainder copper.

29. The package of claim 27 wherein said first and second members have a first and second claddings, respectively, each of said claddings comprising a metal or metal alloy having a coefficient of conductivity in excess of about 50% IACS, said first and second claddings being disposed against a second surface of said first and second members, respectively, opposite said first and third refractory oxide layers, respectively.

30. The package of claim 25 wherein said first and second metal or metal alloy members comprise an iron or iron alloy.

31. The package of claim 25 wherein said first and second metal or metal alloy members comprise a nickel or nickel alloy.

* * * * *